(12) United States Patent
Ono

(10) Patent No.: US 6,486,012 B1
(45) Date of Patent: Nov. 26, 2002

(54) SEMICONDUCTOR DEVICE HAVING FIELD EFFECT TRANSISTORS DIFFERENT IN THICKNESS OF GATE ELECTRODES AND PROCESS OF FABRICATION THEREOF

(75) Inventor: Atsuki Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 09/614,700

(22) Filed: Jul. 12, 2000

Related U.S. Application Data

(62) Division of application No. 08/808,422, filed on Feb. 28, 1997, now Pat. No. 6,166,413.

(30) Foreign Application Priority Data

Feb. 28, 1996 (JP) ................................................ 8-41156

(51) Int. Cl.[7] .................. H01L 21/8238; H01L 21/3205
(52) U.S. Cl. ...................... 438/199; 438/218; 438/231; 438/595
(58) Field of Search .................................. 438/197, 199, 438/207, 218, 223, 231, 587, 595

(56) References Cited

U.S. PATENT DOCUMENTS

| | | | |
|---|---|---|---|
| 4,824,796 A | * | 4/1989 | Chiu et al. .................. 438/229 |
| 4,931,411 A | | 6/1990 | Tigelaar et al. |
| 5,021,354 A | | 6/1991 | Pfiester |
| 5,296,401 A | * | 3/1994 | Mitsui et al. ................ 438/231 |
| 5,496,771 A | * | 3/1996 | Cronin et al. ................ 438/620 |
| 5,567,642 A | * | 10/1996 | Kim et al. .................... 438/232 |

FOREIGN PATENT DOCUMENTS

| | | |
|---|---|---|
| GB | 2 257 563 A | 1/1993 |
| JP | 4-32260 | 2/1992 |
| JP | 4-254371 | 9/1992 |
| JP | 7-153847 | 6/1995 |

OTHER PUBLICATIONS

E. Hasegawa et al., "The impact of nitrogen profile engineering on ultra–thin nitrided oxide films for dual–gate CMOS ULSI," *IEDM 95*, 1995, pp. 327–330.

* cited by examiner

*Primary Examiner*—Matthew Smith
*Assistant Examiner*—Lex H. Malsawma
(74) *Attorney, Agent, or Firm*—Sughrue Mion, PLLC

(57) ABSTRACT

An n-channel type field effect transistor and a p-channel type field effect transistor are fabricated on a p-type well and an n-type well, respectively, and the arsenic-doped gate electrode of the n-channel type field effect transistor is thinner than the boron-doped gate electrode of the p-channel type field effect transistor so that the arsenic and the boron are appropriately diffused in the gate electrodes during a rapid annealing.

7 Claims, 7 Drawing Sheets

SEMICONDUCTOR DEVICE HAVING FIELD EFFECT TRANSISTORS DIFFERENT IN THICKNESS OF GATE ELECTRODES AND PROCESS OF FABRICATION THEREOF

This is a divisional of application Ser. No. 08/808,422 filed Feb. 28, 1997 and now U.S. Pat. No. 6,166,413, disclosure of which is incorporated herein by reference.

FIELD OF THE INVENTION

This invention relates to a semiconductor device and, more particularly, to a semiconductor device having an n-channel type field effect transistor and a p-channel type field effect transistor different in thickness of the gate electrodes and a process of fabrication thereof.

DESCRIPTION OF THE RELATED ART

The integration density of the semiconductor device has been increased, and miniaturization of circuit components allows the manufacturer to increase the integration density. One of the most important circuit components is a field effect transistor, and shallow source and drain regions and a thin gate insulating layer are indispensable for the miniature field effect transistor.

Field effect transistors are broken down into two categories. The first category is featured by a surface channel structure, and the second category is featured by a buried-channel structure. When an enhancement type field effect transistor creates a conductive channel identical in conductivity type with the gate electrode, the enhancement type field effect transistor is categorized into the first category. If a surface channel type field effect transistor has an n-type gate electrode, the surface channel type field effect transistor inverts the channel region to the n-type. On the other hand, if a surface channel type field effect transistor has a p-type gate electrode, the channel region is inverted to the p-type so as to flow drain current therethrough. The surface channel structure is suitable for the miniaturization of the field effect transistor.

The buried channel structure is disadvantageous to the miniaturization. Presently, it is impossible to employ the buried channel structure in a semiconductor device designed on the basis of quarter-micron design rules. A p-channel buried channel structure type field effect transistor has a boron-doped buried layer under an n-type doped polysilicon, and the boron-doped buried layer should be as shallow as possible against the punch-through phenomenon. However, the boron is rapidly diffused, and the boron-doped buried channel tends to be deep. Thus, the buried channel structure is disadvantageous to the miniature field effect transistor with a short channel.

The fabrication process is different between the surface channel type field effect transistor and the buried channel type field effect transistor. For example, dopant impurity is usually ion introduced into the gate electrode of the surface channel type field effect transistor during the ion-implantation into surface regions on both sides of the channel region, and, accordingly, the gate electrode and the source/drain regions are doped with the same dopant impurity. On the other hand, a dopant impurity is diffused from a phospho-glass into the gate electrode of the buried channel type field effect transistor. If a p-channel type field effect transistor and an n-channel type field effect transistor are fabricated on a semiconductor substrate, the dopant impurity is concurrently driven into both gate electrodes.

FIGS. 1A to 1E illustrates a typical example of the process of fabricating a surface channel type complementary transistor. An n-channel type field effect transistor 1 and a p-channel type field effect transistor 2 form in combination the surface channel type complementary transistor.

The prior art process starts with preparation of a silicon substrate 3. A thick field oxide 4a is selectively grown on the major surface of the silicon substrate 3 by using the LOCOS (local oxidation of silicon) technology, and separates the major surface into a plurality of active areas. FIGS. 1A to 1E show two active areas, and the two active areas are assigned to the n-channel type field effect transistor 1 and the p-channel type field effect transistor 2, respectively.

The right active area is covered with a photo-resist ion-implantation mask (not shown), and boron is ion implanted into the left active area for forming a p-type well 3a. The ion-implantation is repeated under different conditions. The boron is firstly accelerated under 300 KeV at dose of $1\times10^{13}$ cm$^{-2}$, thereafter, under 150 KeV at dose of $3\times10^{12}$ cm$^{-2}$ and under 40 keV at dose of $7\times10^{12}$ cm$^{-2}$.

The photo-resist ion-implantation mask is stripped off, and, thereafter, the left active area is covered with another photo-resist ion-implantation mask (not shown). Phosphorous or arsenic is repeatedly ion implanted into the right active area. If the phosphorous is used, the first ion-implantation is carried out under the acceleration energy of 700 KeV at dose of $1.33\times10^{13}$ cm$^{-2}$, thereafter, the acceleration energy and the dose are changed to 300 KeV and $4\times10^{12}$ cm$^{-2}$, and, finally, the ion-implantation is carried out under the acceleration energy of 60 KeV at dose of $5\times10^{12}$ cm$^{-2}$. The photo-resist ion-implantation mask is stripped off, and the ion-implanted phosphorous forms an n-type well 3b as shown in FIG. 1A.

Subsequently, the silicon substrate 3 is placed in high-temperature dry oxidation ambience. The surface of the p-type well 3a and the surface of the n-type well 3b are thermally oxidized at 850 degrees in centigrade, and the p-type well 3a and the n-type well 3b are covered with thin gate oxide layers 1a and 2a of 6 nanometers thick, respectively.

Subsequently, polysilicon is deposited to 150 to 200 nanometers thick over the entire surface of the semiconductor structure by using a chemical vapor deposition, and the thin gate oxide layers 1a/2a are covered with a polysilicon layer. In this instance, silane or disilane is introduced into a reaction chamber where the silicon substrate 3 is placed, and is decomposed at 650 degrees in centigrade. The silicon layer is intentionally undoped.

Photo-resist solution is spread over the undoped polysilicon layer, and is baked so as to form a photo-resist layer. A pattern image for gate electrodes is optically transferred from a photo-mask (not shown) to the photo-resist layer by using ultra-violet light or excimer laser light, and a latent image is formed in the photo-resist layer. The photo-resist layer is patterned into a photo-resist etching mask 5a through a development of the latent image.

The undoped polysilicon is patterned into gate electrodes 1b/2b by using a dry etching technique. The gaseous etchant has a large selectivity between the undoped polysilicon and the silicon oxide, and the thin gate oxide layers 1a/1b are not damaged. The resultant structure after the dry etching is shown in FIG. 1B. The photo-resist etching mask 5a is stripped off.

Subsequently, silicon oxide is deposited to 100 to 150 nanometers thick over the entire surface of the resultant structure by using a chemical vapor deposition. Silane and oxygen are introduced into a reaction chamber where the silicon substrate 3 is placed, and the silicon oxide is produced at 800 degrees in centigrade. The silicon oxide layer topographically extends over the thin gate oxide layers 1a/2a and the undoped polysilicon gate electrodes 1b/2b.

The silicon oxide layer is anisotropically etched by using a plasma etching system, and side wall spacers 1c/2c are left on both sides of the gate electrodes 1b/2b as shown in FIG. 1C.

Subsequently, silicon oxide is deposited to 5 to 10 nanometers thick over the entire surface of the resultant structure shown in FIG. 1D, and a thin silicon oxide layer 4b topographically extends. The p-type well 3a is covered with a photo-resist ion-implantation mask (not shown), and arsenic is ion implanted into the n-type well 3a at dose of $5 \times 10^{15}$ cm$^{-2}$ under the acceleration energy of 50 KeV. The arsenic is introduced into the p-type well 3a and the gate electrode 1b, and forms n-type source/drain regions 1d/1e.

The ion-implantation mask is stripped off, and the n-type well 3b is covered with another photo-resist ion-implantation mask (not shown). Boron fluoride (BF$_2$) is ion implanted into the n-type well 3b at dose of $3 \times 10^{15}$ cm$^{-2}$ under the acceleration energy of 30 KeV. The boron fluoride is introduced into the n-type well 3b and the gate electrode 2b, and forms p-type source/drain regions 2d/2e. The photo-resist ion-implantation mask is stripped off, and the ion-implanted arsenic and the ion-implanted boron fluoride are activated in nitrogen ambience at 1000 degrees in centigrade for 10 seconds by using a lamp annealing system. The ion-implanted dopant impurities are diffused during the lamp annealing, and the n-type source/drain regions 1d/1e and the p-type source/drain regions 2d/2e penetrate into the p-type well 3a and the n-type well 3b under the side wall spacers 1c and 2c as shown in FIG. 1D.

Subsequently, boron/phosphorous-doped insulating material is deposited over the entire surface of the resultant structure shown in FIG. 1D by using a chemical vapor deposition, and forms an inter-level insulating layer 4c. A photo-resist layer is patterned into a photo-resist etching mask (not shown) on the inter-level insulating layer 4c, and the photo-resist etching mask exposes parts of the inter-level insulating layer to etchant. The parts of the inter-level insulating layer 4c are removed, and contact holes 4d are formed in the inter-level insulating layer 4c. The n-type source/drain regions 1d/1e and the p-type source/drain regions 2d/2e are exposed to the contact holes. The photo-resist etching mask is stripped off after the formation of the contact holes 4d.

Aluminum alloy is deposited over the inter-level insulating layer by using a sputtering. The aluminum alloy fills the contact holes 4d, and swells into an aluminum alloy layer extending on the inter-level insulating layer 4c. The aluminum alloy in the contact holes 4d is held in contact with the n-type source/drain regions 1d/1e and the p-type source/drain regions 2d/2e.

A photo-resist layer is patterned into a photo-resist etching mask (not shown) on the aluminum alloy layer, and the aluminum alloy layer is selectively etched away so as to form the aluminum alloy layer into upper-level metal wirings 6a, 6b, 6c and 6d as shown in FIG. 1E.

The n-channel type field effect transistor 1 and the p-channel type field effect transistor 2 are appropriately connected through the upper-level metal wirings, and form in combination the complementary transistor. The n-channel type field effect transistor 1 and the p-channel type field effect transistor 2 respectively have the gate electrode 1b doped with the n-type dopant impurity and the gate electrode 2b doped with the p-type dopant impurity, and the gate electrode 1b of the n-type polysilicon and the gate electrode 2b of the p-type polysilicon create an n-type channel region between the n-type source and drain regions 1d and 1e and a p-type channel region between the p-type source and drain regions 2d and 2e, respectively. Thus, the n-channel type field effect transistor 1 and the p-channel type field effect transistor 2 serve as the surface channel type field effect transistors.

However, the prior art complementary transistor encounters a problem in that the manufacturer can not appropriately control the ion-implantations into the gate electrodes 1b/2b and the source and drain regions 1d/1e and 2d/2e. The difficulty of ion-implantations is detailed hereinbelow. As described hereinbefore, the surface channel type field effect transistor requires the gate electrode and the source and drain regions concurrently doped with a dopant impurity. However, the two kinds of dopant impurity are usually different in diffusion coefficient, and the ion-implanted dopant impurities are simultaneously activated during the rapid annealing. In the above described prior art, the arsenic is ion implanted into the gate electrode 1b and the p-type well 3a, because the arsenic is small in diffusion coefficient. Moreover, the acceleration energy is low enough to form the shallow p-n junctions in the p-type well 3a, and the dose is selected in such a manner as not to be affected by a parasitic resistance. In this way, the ion-implantation conditions are determined in consideration of the shallow source and drain regions. However, the arsenic is diffused in the polysilicon at low speed. Therefore, the arsenic doped into the polysilicon gate electrode 1b hardly reaches the boundary between the thin gate oxide layer 1a and the gate electrode 1b, and the lower portion of the gate electrode 1b tends to be short in the dopant concentration. The shortage of dopant concentration is causative of a depletion layer extending in the gate electrode 1b at the turn-on, and, accordingly, increases the effective thickness of the gate oxide layer 1a. The increased thickness of the gate oxide layer 1a deteriorates the short-channel characteristics, and decreases the amount of channel current.

If the manufacturer makes the gate electrode 1b thinner, the arsenic can reach the boundary between the gate oxide layer 1a and the gate electrode 1b, and the n-channel type field effect transistor 1 may be free from the deterioration due to the shortage of the arsenic. However, the gate electrodes 1b and 2b are concurrently patterned from the undoped polysilicon layer. When the manufacturer decreases the thickness of the gate electrode 1b, the other gate electrode 2b is also made thinner. The thin gate electrode 2b encounters another problem in that the boron penetrates from the gate electrode 2b through the gate oxide layer 2a into the channel region during the rapid annealing, because the boron is larger in diffusion coefficient than the arsenic. The boron introduced into the channel region changes the threshold of the p-channel type field effect transistor, and deteriorates the reliability.

Thus, there is a trade-off between the depth of the source/drain regions and the transistor characteristics, and the manufacturer hardly optimizes the process parameters. When the field effect transistors 1/2 are further miniaturized, the optimization becomes more difficult.

SUMMARY OF THE INVENTION

It is therefore an important object of the present invention to provide a semiconductor device two kinds of field effect transistor of which have shallow source and drain regions without sacrifice of the transistor characteristics.

It is also an important object of the present invention to provide a process of fabricating a semiconductor device process parameters of which are easily optimized by a manufacturer.

To accomplish the object, the present invention proposes to make the thicknesses of gate electrodes of two kinds of field effect transistors different.

In accordance with the present invention, there is provided a semiconductor device fabricated on a single semiconductor substrate having a first surface portion of a first conductivity type and a second surface portion of a second conductivity type opposite to the first conductivity type, comprising: a first field effect transistor including first source and drain regions formed in the first surface portion and spaced from each other by a first channel region, the first source and drain regions being doped with a first dopant impurity for imparting the second conductivity type thereto, a first gate insulating layer formed on the first channel region, and a first gate electrode on the first gate insulating layer doped with the first dopant impurity and having a first thickness; and a second field effect transistor including second source and drain regions formed in the second surface portion and spaced from each other by a second channel region, the second source and drain regions being doped with a second dopant impurity having a diffusion coefficient smaller than that of the first dopant impurity for imparting the first conductivity type thereto, a second gate insulating layer formed on the second channel region, and a second gate electrode on the second gate insulating layer doped with the second dopant impurity and having a second thickness smaller than the first thickness.

In accordance with another aspect of the present invention, there is provided a process of fabricating a semiconductor device comprising the steps of: a) preparing a semiconductor substrate having a first surface portion of a first conductivity type and a second surface portion of a second conductivity type opposite to the first conductivity type; b) covering the first surface portion and the second surface portion with a first gate insulating layer and a second gate insulating layer; c) forming a polysilicon layer on the first and second gate insulating layers; d) forming a first gate electrode on the first gate insulating layer and a second gate electrode on the second gate insulating layer from the polysilicon layer, the first gate electrode and the second gate electrode respectively having a first thickness and a second thickness different to each other; e) introducing a first dopant impurity into the a first gate electro de and the first surface portion for imparting the second conductivity type to first source and drain regions; and f) introducing a second dopant impurity into the second gate electrode and the second surface portion for imparting the first conductivity type second source and drain regions, the second dopant impurity being different in diffusion coefficient from the first dopant impurity.

BRIEF DESCRIPTION OF THE DRAWINGS

The features and advantages of the semiconductor device and the process according to the present invention will be more clearly understood from the following description taken in conjunction with the accompanying drawings in which.

DESCRIPTION OF THE PREFERRED EMBODIMENT

Figure 1A:
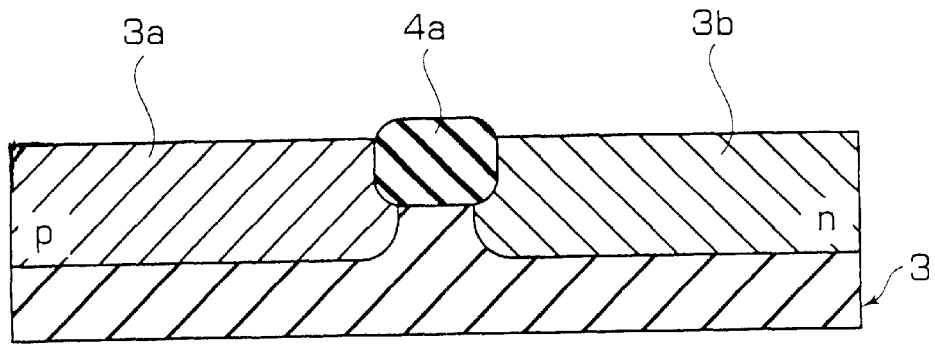
FIGS. 1A to 1E are cross sectional views showing the prior art process sequence for fabricating the surface channel type complementary transistor.
Figure 1B:
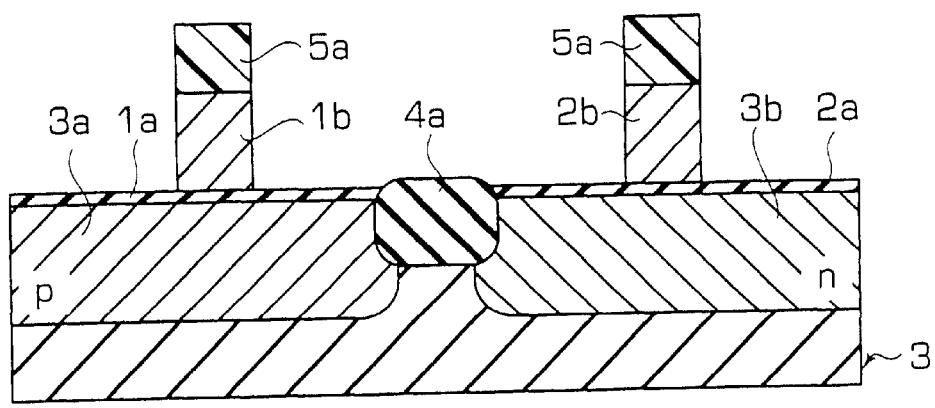
Figure 1C:
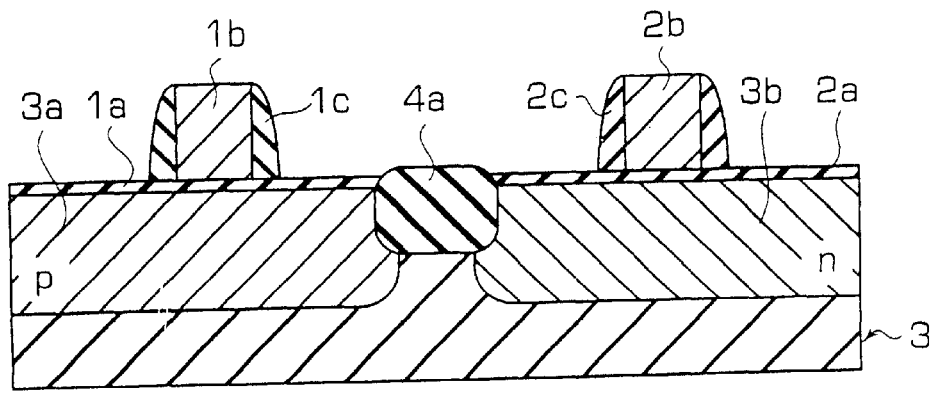
Figure 1D:
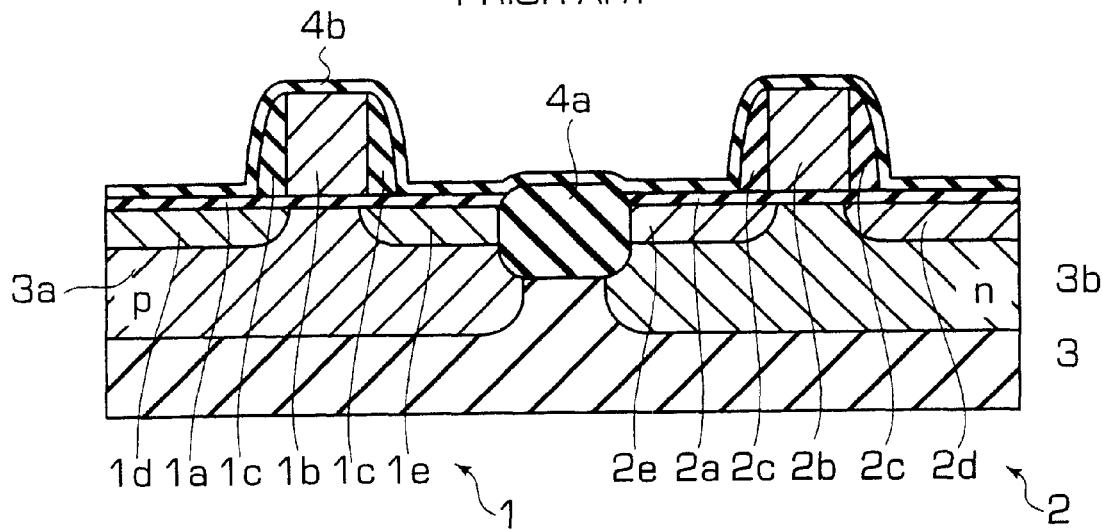
Figure 1E:
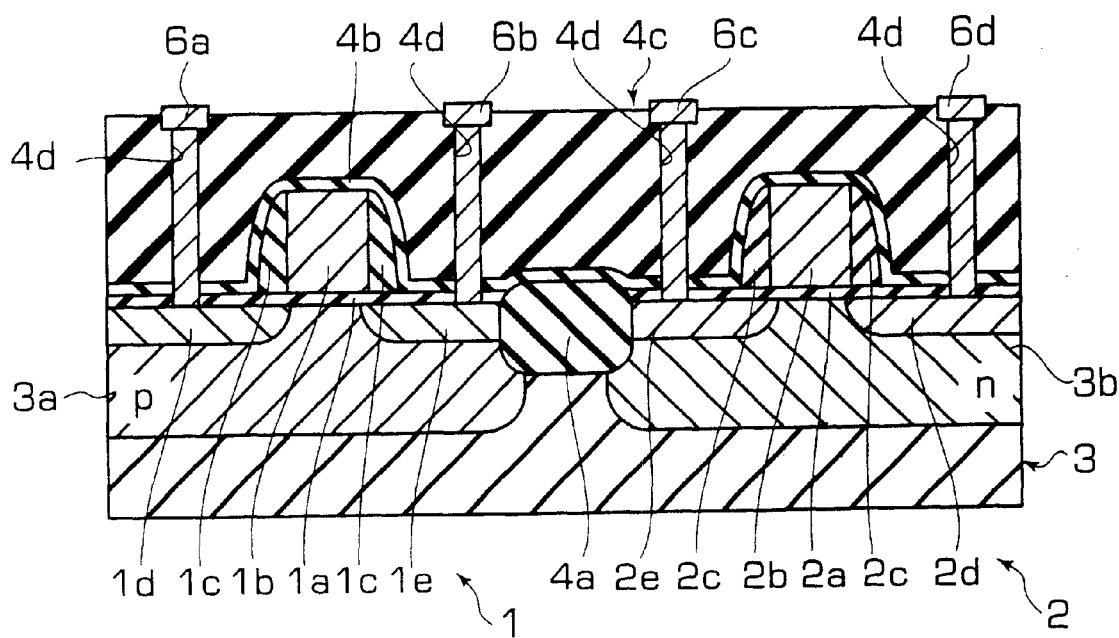

Description is firstly made on a process sequence embodying the present invention with reference to FIGS. 2A to 2J of the drawings. The process starts with preparation of a silicon substrate 20, and a thick field oxide layer 21a is selectively grown on the major surface of the silicon substrate 20. The LOCOS techniques may be used for the formation of the thick field oxide layer 21a. The thick field oxide layer 21a separates the major surface into a plurality of active areas, and two active areas are respectively assigned to an n-channel type field effect transistor 22 and a p-channel type field effect transistor 23.

A p-type well 20a and an n-type well 20b are respectively formed in the two active areas as follows. The ion-implantations are used for the formation of the wells 20a and 20b, and the thresholds of the field effect transistors and the withstanding voltage are taken into account. In this instance, the p-type well 20a is firstly formed in the left active area, and, thereafter, the n-type well 20b is formed in the right active area.

The left active area is uncovered with a photo-resist ion-implantation mask (not shown), and boron is ion implanted into the left active area for forming the p-type well 20a. The ion-implantation is repeated under different conditions. The boron is firstly accelerated under 300 KeV at dose of $1 \times 10^{13}$ cm$^{-2}$, thereafter, under 150 KeV at dose of $3 \times 10^{12}$ cm$^{-2}$ and under 40 keV at dose of $7 \times 10^{12}$ cm$^{-2}$.

Figure 2A:
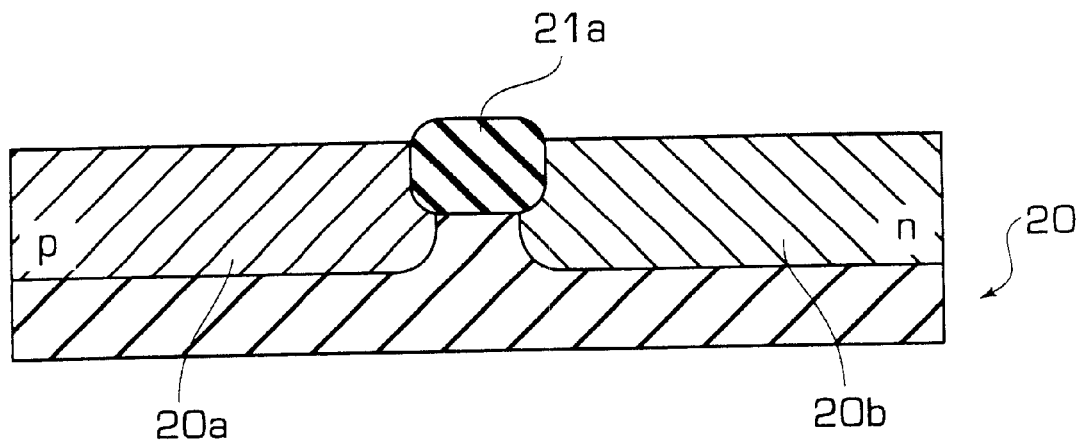
FIGS. 2A to 2J are cross sectional views showing the sequence of a process according to the present invention.

The photo-resist ion-implantation mask is stripped off, and, thereafter, the right active area is uncovered with another photo-resist ion-implantation mask (not shown). Phosphorous is repeatedly ion implanted into the right active area. The first ion-implantation is carried out under the acceleration energy of 700 KeV at dose of $1.5 \times 10^{13}$ cm$^{-2}$, thereafter, the acceleration energy and the dose are changed to 300 KeV and $4 \times 10^{12}$ cm$^{-2}$, and finally, the ion-implantation is carried out under the acceleration energy of 60 KeV at dose of $5 \times 10^{12}$ cm$^{-2}$. The photo-resist ion-implantation mask is stripped off, and the ion-implanted phosphorous forms the n-type well 20b as shown in FIG. 2A.

The silicon substrate 20 is placed in dry oxidation ambience, and the surface of the p-type well 20a and the surface of the n-type well 20b are thermally oxidized at 850 degrees in centigrade. Gate oxide layers 22a and 23a are grown to 6 nanometers thick on the left and right active areas.

Subsequently, the silicon substrate 20 is placed into a-reaction chamber of a chemical vapor deposition system (not shown), and silane or disilane is decomposed at 650 degrees in centigrade. Undoped polysilicon is deposited on the entire surface of the structure, and the gate oxide layers 22a and 23a are covered with an undoped polysilicon layer 24a. Even though dopant impurity may be unintentionally introduced into the undoped polysilicon, the dopant concentration is less than $1 \times 10^{16}$ cm$^{-3}$. in this instance, the thickness of the undoped polysilicon layer 24a ranges from 200 nanometers to 300 nanometers, because boron can not penetrate through a polysilicon gate electrode doped with boron fluoride at $3 \times 10^{15}$ cm$^{-2}$ under acceleration energy of 30 KeV during a rapid annealing at 1000 degrees in centigrade for 10 seconds.

Figure 2B:
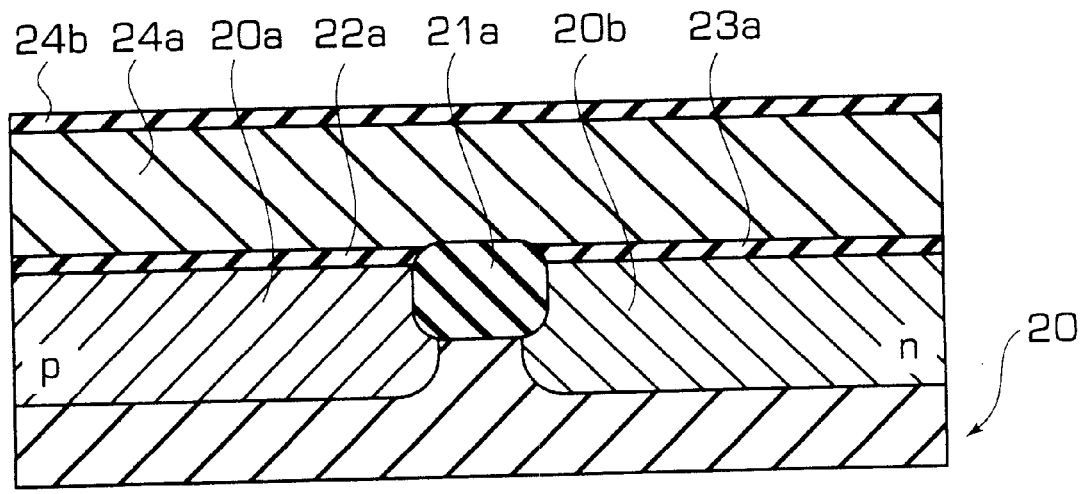

After the deposition of the undoped polysilicon, silicon nitride is deposited to 20 nanometers thick to 40 nanometers thick over the undoped polysilicon layer 24a by using a chemical vapor deposition. The silicon nitride is produced from gaseous mixture of silane and ammonia at 700 degrees in centigrade. As a result, the undoped polysilicon layer 24a is overlain by a silicon nitride layer 24b as shown in FIG. 2B.

Photo-resist solution is spread over the silicon nitride layer 24b, and is baked so as to cover the silicon nitride layer 24b with a photo-resist layer. An pattern image of gate electrodes is formed in a photo mask (not shown), and the photo-mask is aligned with the photo-resist layer. Ultra-violet light or excimer laser light is radiated to the photo-mask, and the pattern image is transferred to the photo-resist layer so as to form a latent image therein. The latent image is developed, and the photo-resist layer is patterned into a photo-resist etching mask 25a.

Figure 2C:
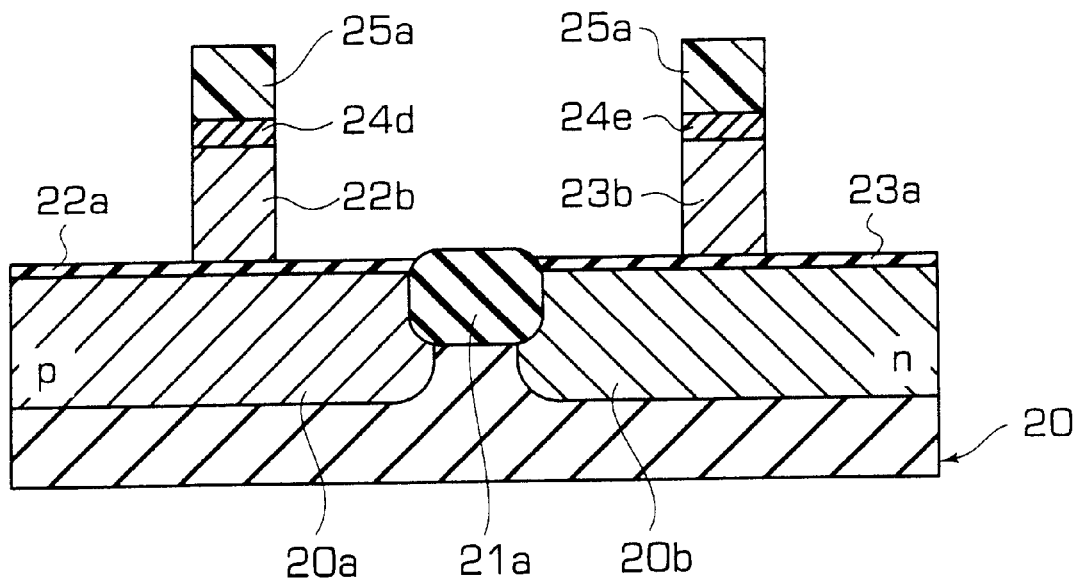

The silicon substrate 20 is placed in a reaction chamber of a plasma etching system (not shown), and the photo-resist etching mask 25a exposes a part of the silicon nitride layer 24b and a part of the undoped polysilicon layer 24b to gaseous etchant, and the gaseous etchant selectively removes the silicon nitride layer 24b and the undoped polysilicon layer 24a. As a result, the silicon nitride layer 24b and the undoped polysilicon layer 24b are patterned into silicon nitride strips 24d and 24e and undoped polysilicon gate electrodes 22b and 23b as shown in FIG. 2C. Although the gaseous etchant for patterning the undoped polysilicon layer 24a has a large selectivity between the undoped polysilicon and the silicon oxide, the gate oxide layers 22a and 23a are partially etched away, and the gate oxide layers 22a/23a are decreased in thickness.

Subsequently, silicon oxide is deposited to 100 nanometers to 150 nanometers thick over the entire surface of the structure by using a chemical vapor deposition, and silane gas and oxygen gas are used in the chemical vapor deposition. The silane is decomposed and reacts with the oxygen at 800 degrees in centigrade. A silicon oxide layer topographically extends over the undoped polysilicon gate electrodes 22b/23b and the silicon nitride strips 24d/24e. The silicon oxide layer is anisotropically etched by using a plasma etching system, and is formed into side wall spacers 22c and 23c as shown in FIG. 2D.

Figure 2D:
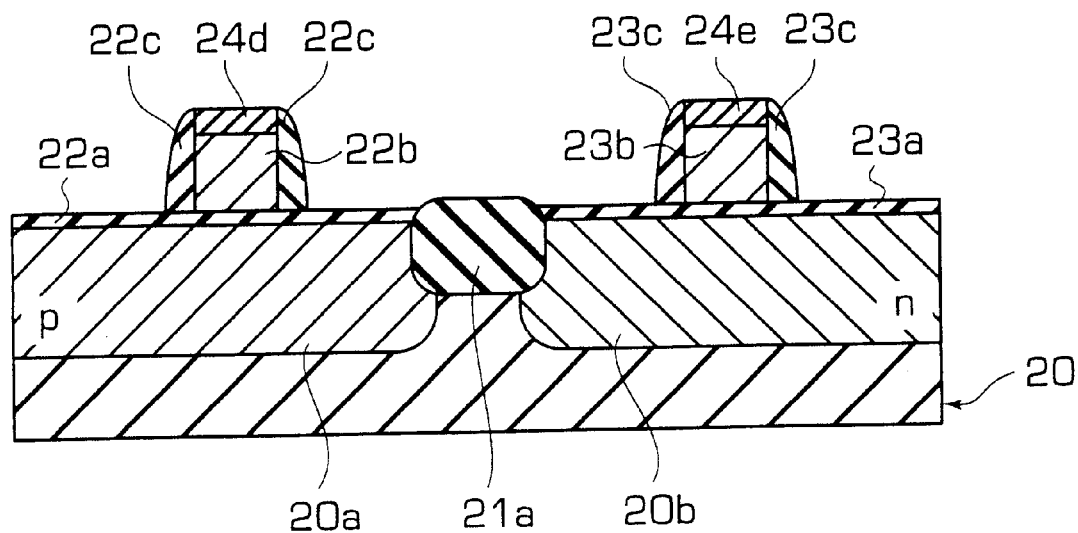

The resultant structure shown in FIG. 2D is placed in an oxidation ambience, and the oxidation increases the silicon oxide 22d/23d on both sides of the undoped polysilicon gate electrodes 22b/23b by 5 nanometers to 10 nanometers thick. However, the silicon nitride strips 24d and 24e are never oxidized.

Figure 2E:
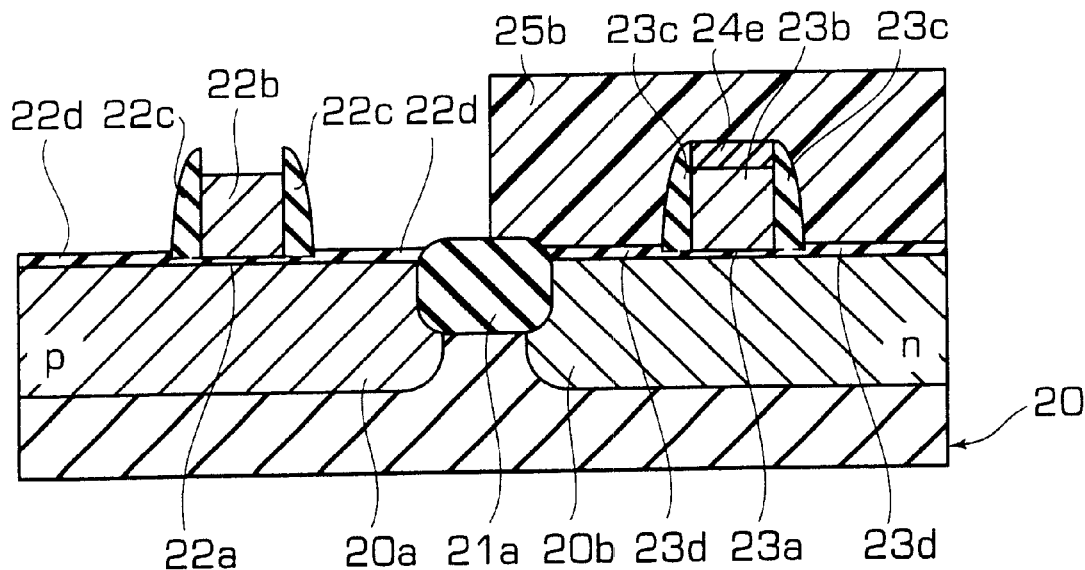

A photo-resist mask 25b is patterned from a photo-resist layer, and the p-type well 20a is uncovered with the photo-resist mask 25b. The silicon nitride strip 24d is exposed to phosphoric acid at 65 degrees in centigrade. The hot phosphoric acid removes the silicon nitride strip 24d; however, the silicon oxide layers 22d, the side wall spacers 22c and the undoped polysilicon gate electrode 22b is never damaged by the phosphoric acid. Thus, the upper surface of the undoped polysilicon gate electrode 22b is exposed to a gap in the side wall spacer 22c as shown in FIG. 2E.

Figure 2F:
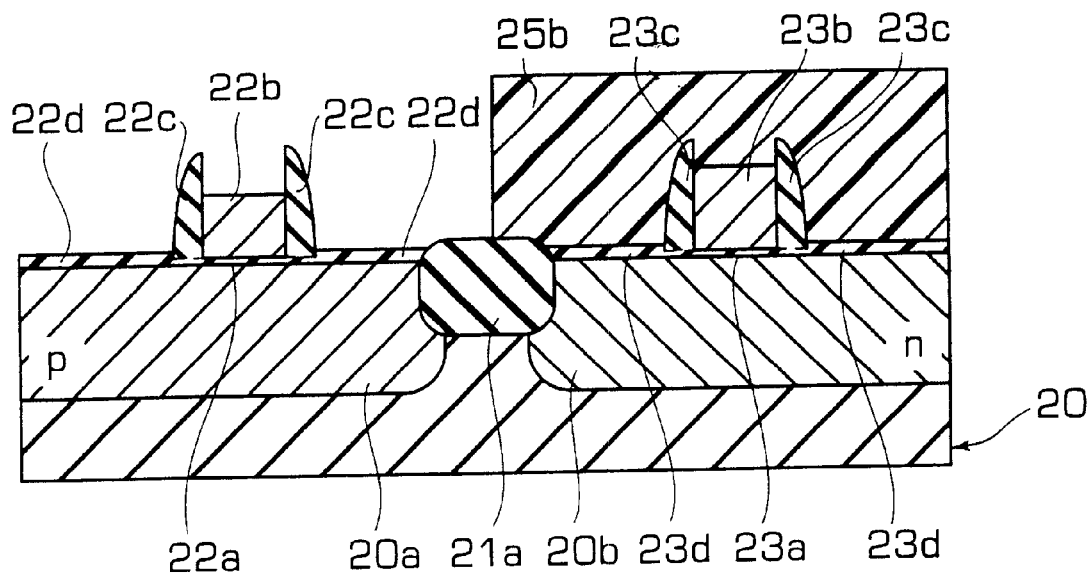

The undoped polysilicon gate electrode 22b is partially etched away, and the height of the undoped polysilicon gate electrode 22b is decreased as shown in FIG. 2F. The undoped polysilicon gate electrode 22b becomes thin, and a depletion layer does not take place under application of a positive gate voltage. In this instance, arsenic is diffused at 1000 degrees in centigrade for 10 seconds after an ion-implantation into the undoped polysilicon gate electrode 22b at dose of $5 \times 10^{15}$ cm$^{-2}$ under acceleration energy of 50 KeV as described hereinlater, and the undoped polysilicon gate electrode 22b is decreased to 150 nanometers thick. While the undoped polysilicon gate electrode 22b is being partially etched away, the silicon oxide layer 22d prevents the p-type well 20a from the etchant, and the p-type well 20a is never damaged.

Figure 2G:
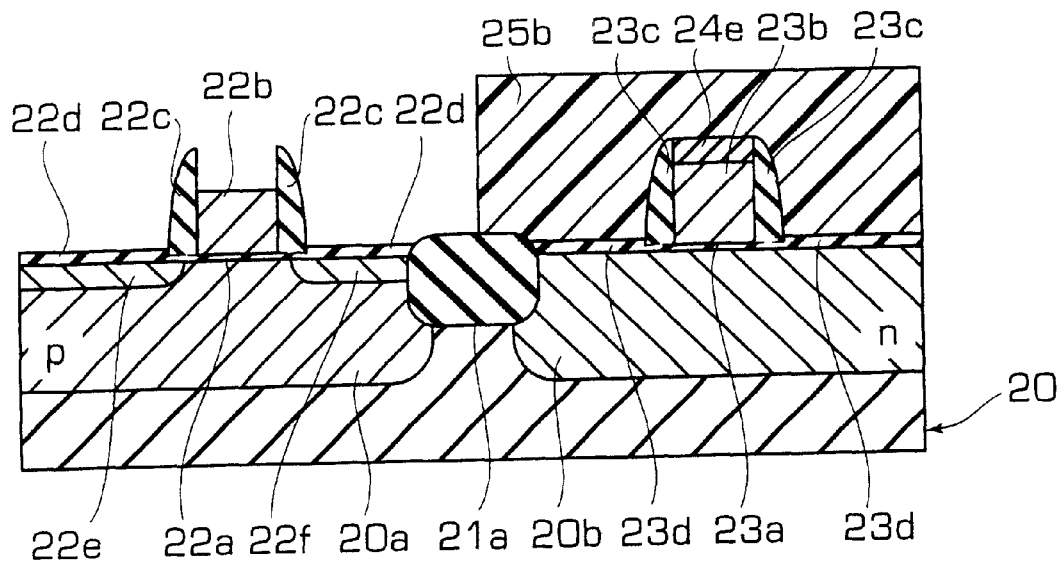

Arsenic is ion implanted into the p-type well 20a and the undoped polysilicon gate electrode 22b at dose of $5 \times 10^{15}$ cm$^{-2}$ under the acceleration energy of 50 KeV. The undoped polysilicon gate electrode 22b is converted to a doped polysilicon gate electrode 22b', and surface regions 22e and 22f are doped with n-type dopant impurity as shown in FIG. 2G.

Figure 2H:
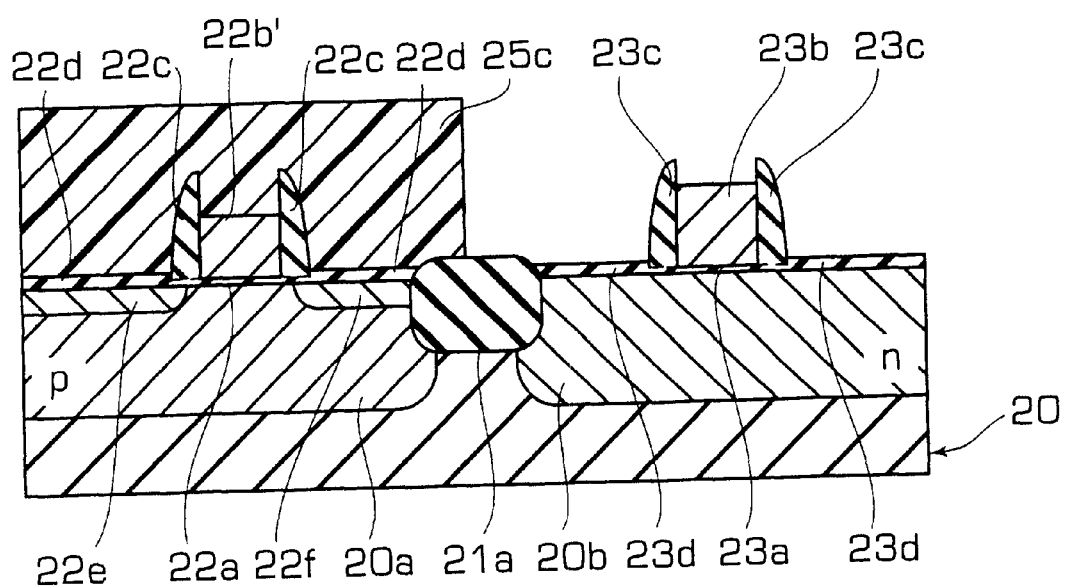

The photo-resist mask 25b is stripped off, and a photo-resist mask 25c is patterned from a photo-resist layer. The n-type well 20b is uncovered with the photo-resist mask 25c. The silicon nitride strip 24e is exposed to the phosphoric acid at 65 degrees in centigrade, and is etched away as shown in FIG. 2H. The undoped polysilicon gate electrode 23b is exposed to a gap in the side wall spacer 23c. However, the undoped polysilicon gate electrode 23b is never etched, and, accordingly, the undoped polysilicon gate electrode 23b is higher than the doped polysilicon gate electrode 22b'.

Figure 2I:
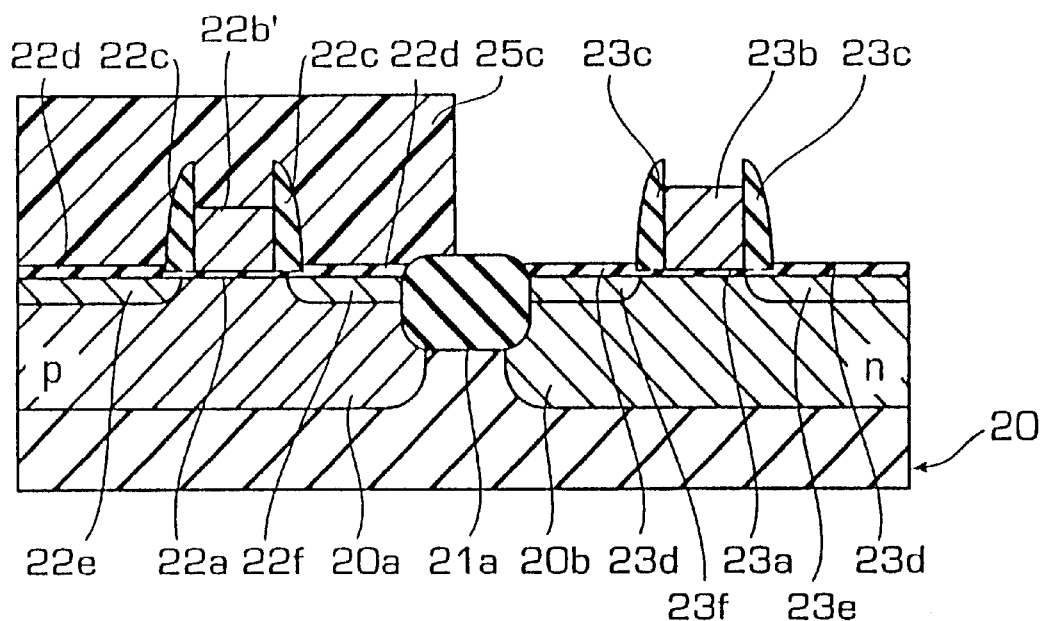

Boron fluoride expressed as $BF_2$ is ion implanted into the n-type well 20b and the undoped polysilicon gate electrode 23b at dose of $3 \times 10^{15}$ cm$^{-2}$ under the acceleration energy of 30 KeV. The undoped polysilicon gate electrode 23b is converted to a doped polysilicon gate electrode 23b', and surface regions 23e/23f are doped with p-type dopant impurity as shown in FIG. 2I.

Subsequently, the photo-resist mask 25c is stripped off, and the resultant structure is subjected to a lamp annealing using a halogen lamp. The annealing is carried out at 1000 degrees in centigrade for 10 seconds, and the surface regions 22e/22f and 23e/23f serve as n-type source and drain regions 22e'/22f' and p-type source and drain regions 23e'/23f'.

Boron/phosphorous-doped insulating material is deposited over the entire surface of the resultant structure by using a chemical vapor deposition, and forms an inter-level insulating layer 21b. A photo-resist layer is patterned into a photo-resist etching mask (not shown) on the inter-level insulating layer 21b, and the photo-resist etching mask exposes parts of the inter-level insulating layer 21b to etchant. The parts of the interlevel insulating layer 21b are removed, and contact holes 21c are formed in the inter-level insulating layer 21b. The n-type source/drain regions 22e'/22f' and the p-type source/drain regions 22e'/22f' are exposed to the contact holes 21c. The photo-resist etching mask is stripped off after the formation of the contact holes 21c.

Aluminum alloy is deposited over the inter-level insulating layer 21b by using a sputtering. The aluminum alloy fills the contact holes 21c, and swells into an aluminum alloy layer extending on the inter-level insulating layer 21b. The aluminum alloy in the contact holes 21c is held in contact with the n-type source/drain regions 22e'/22f' and the p-type source/drain regions 23e'/23f'.

Figure 2J:
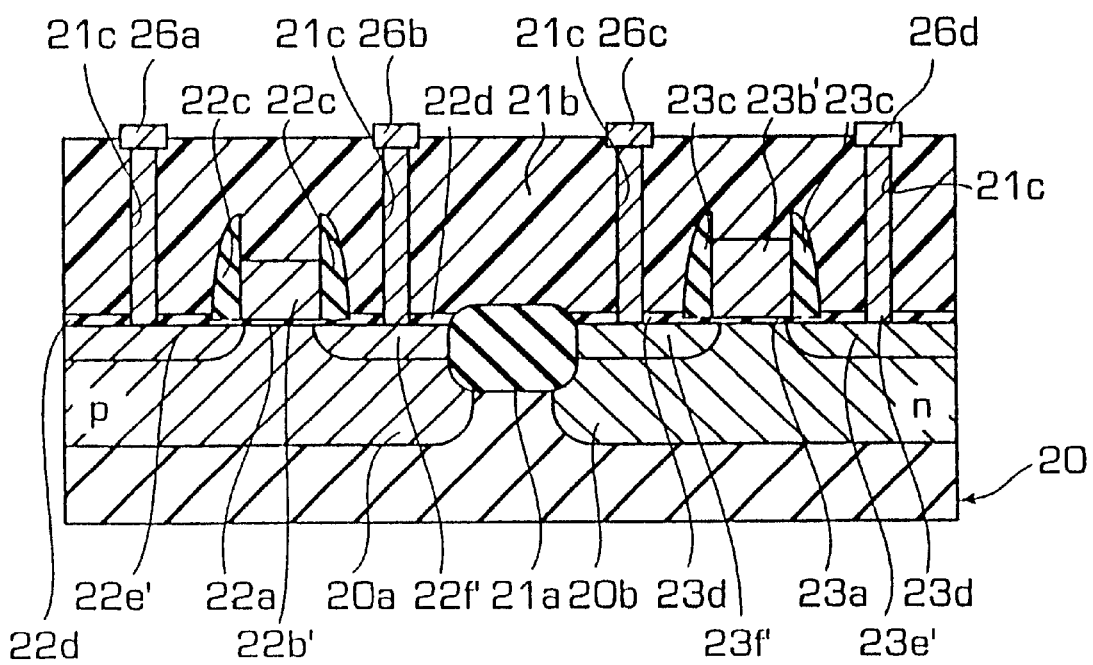

A photo-resist layer is patterned into a photo-resist etching mask (not shown) on the aluminum alloy layer, and the aluminum alloy layer is selectively etched away so as to form the aluminum alloy layer into upper-level metal wirings 26a, 26b, 26c and 26d as shown in FIG. 2J. The upper level metal wirings 26d and 26a may be connected to a positive power voltage source and a ground line, and the upper level metal wirings 26b and 26c are connected to each other for forming a complementary transistor.

As will be appreciated from the foregoing description, the doped polysilicon gate electrodes 22b' and 23b' according to the present invention are appropriately adjusted to respective thicknesses. As a result, the two kinds of dopant impurity are appropriately diffused in the gate electrodes 22b'/23b', and form the shallow source and drain regions 22e'/22f' and 23e'/23f'. The arsenic reaches the boundary between the gate oxide layer 22a and the doped polysilicon gate electrode 22b', and the boron does not penetrate through the gate oxide layer 23a into the channel region. For this reason, the n-channel type field effect transistor 22 and the p-channel type field effect transistor 23 are stable in transistor characteristics.

Although a particular embodiment of the present invention has been shown and described, it will be obvious to those skilled in the art that various changes and modifications may be made without departing from the spirit and scope of the present invention.

For example, the side wall spacer may be formed of another insulating material. In this instance, it is better to deposit the insulating material after the thermal oxidation of the undoped polysilicon gate electrodes, because the silicon oxide enhances the adhesion between the undoped polysilicon layer and the insulating material layer.

Another semiconductor device may have the n-channel type field effect transistor 22 and the p-channel type field effect transistor independently actuated with individual signals. In other words, the field effect transistors 22 and 23 may not form the complementary transistor.

In the above embodiment, the n-channel type field effect transistor is firstly fabricated on the p-type well 20a. However, the p-channel type field effect transistor may be firstly fabricated on the n-type well 20b.

What is claimed is:

1. A process for fabricating a semiconductor device, comprising the steps of:

forming a p-type region and an n-type region isolated from each other by means of an insulating layer in a surface region of a semiconductor substrate;

forming a first insulating layer on said semiconductor substrate;

forming a polysilicon layer on said first insulating layer;

forming a second insulating layer on said polysilicon layer;

patterning said second insulating layer and said polysilicon layer over said p-type and n-type regions into gate structures of n-channel/p-channel insulating gate type field effect transistors;

depositing a third insulating layer over the entire surface of said semiconductor substrate;

masking a region assigned to said p-channel transistor of said both transistors with a first masking layer;

removing said second insulating layer of said gate structure of said n-channel transistor of said both transistors so as to expose said polysilicon layer;

decreasing the thickness of said exposed polysilicon layer;

introducing an n-type impurity into the region assigned to said n-channel transistor under the condition that said region assigned to said p-channel transistor is covered with said first mask layer;

masking said region assigned to said n-channel transistor with a second mask layer; and introducing a p-type impurity into said region assigned to said p-channel transistor.

2. The process for fabricating a semiconductor device as set forth in claim 1, in which said first and third insulating layers are formed of silicon oxide, and said second insulating layer is formed of silicon nitride.

3. The process as set forth in claim 1, in which said polysilicon layer deposited over said first insulating layer is substantially undoped.

4. The process as set forth in claim 3, in which undoped polysilicon contains impurity equal to or less than $1 \times 10$ $cm^{-3}$.

5. The process as set forth in claim 1, further comprising the step of oxydizing said semiconductor substrate before the deposition of said third insulating layer.

6. The process as set forth in claim 1, in which said p-type impurity is boron, and said n-type impurity is arsenic.

7. A process of fabricating a semiconductor device comprising the steps of:

forming a p-type region and an n-type region isolated from each other by means of an insulating layer in a surface region of a semiconductor substrate;

forming a first insulating layer on said semiconductor substrate;

forming a polysilicon layer on said first insulating layer;

forming a second insulating layer on said polysilicon layer;

patterning said second insulating layer and said polysilicon layer over said p-type and n-type regions into gate structures of n-channel/p-channel insulating gate type field effect transistors;

forming wall spacers formed on side surfaces of said gate structures of n-channel/p-channel insulating gate field effect transistors wherein said insulating side wall spacers are substantially equal in their width;

depositing a third insulating layer over the entire surface of said semiconductor substrate;

masking a region assigned to p-channel transistor of said both transistors with a first masking layer;

removing said second insulating layer of said gate structure of said n-channel transistor of said both transistors so as to expose said polysilicon layer;

introducing an n-type impurity into the region assigned to said n-channel transistor under the condition that said region assigned to said p-channel transistor is covered with said first mask layer;

masking said region assigned to said n-channel transistor with a second mask layer; and introducing a p-type impurity into said region assigned to said p-channel transistor.

* * * * *